United States Patent [19]
Jacobus, Jr.

[11] 4,104,597
[45] Aug. 1, 1978

[54] VARIABLE SENSITIVITY MONITOR CIRCUIT

[75] Inventor: Nelson Mortimer Jacobus, Jr., Kensington, Md.

[73] Assignee: Communications Satellite Corp., Washington, D.C.

[21] Appl. No.: 764,608

[22] Filed: Feb. 1, 1977

[51] Int. Cl.² ............................................. H03F 3/58
[52] U.S. Cl. ...................................... 330/43; 330/51; 330/86; 330/207 P
[58] Field of Search ................. 330/43, 51, 86, 207 P; 328/8; 307/200 A; 361/110

[56] References Cited
U.S. PATENT DOCUMENTS

| | | | |
|---|---|---|---|
| 3,030,022 | 4/1962 | Gittleman | 330/86 |
| 3,376,557 | 4/1968 | Godinez | 330/86 UX |
| 3,458,821 | 7/1969 | Clarridge | 330/86 |
| 3,889,202 | 6/1975 | Suzuki | 330/51 |
| 3,890,545 | 6/1975 | Rosen | 330/207 P X |
| 4,005,373 | 1/1977 | Salesky et al. | 330/207 P X |

*Primary Examiner*—James B. Mullins
*Attorney, Agent, or Firm*—Sughrue, Rothwell, Mion, Zinn and Macpeak

[57] ABSTRACT

A variable sensitivity monitor circuit changes sensitivity for a period immediately following startup or turnon of the process or equipment being monitored. By changing sensitivity, the monitor circuit will not respond to the transient produced at startup or turnon but will respond to any abnormal condition greater than the transient without any decrease in response time of the monitor circuit.

5 Claims, 3 Drawing Figures

VARIABLE SENSITIVITY MONITOR CIRCUIT

BACKGROUND OF THE INVENTION

The present invention generally relates to monitor circuits used to detect an abnormal condition in a process or equipment, and more particularly to a monitor circuit in which the sensitivity level is decreased for a period immediately following startup or turnon of the process or equipment so that the monitor circuit does not respond to the transient created by startup or turnon but will respond to an abnormal condition greater than the transient.

It is a common condition in many processes and equipments that a transient condition will be generated upon startup or turnon of the process or equipment. In such processes or equipments wherein conditions are monitored to detect an abnormal condition, this transient condition may have a magnitude which is substantially larger than the steady-state monitored condition limits. While the transient condition may be considered a normal condition incident to the startup or turnon of the process or equipment being monitored, the monitor circuit may nevertheless respond to the transient condition and cause shutdown of the process or equipment. In the past, two techniques have been employed to avoid the erroneous response of monitor circuits to a transient condition produced by startup or turnon of a process or equipment. One technique is to disable the monitor circuit for the period of the transient condition, and the other technique is to slow the response of the monitor circuit to the point where the transient condition will have passed before the monitor circuit can react to it.

While both of the techniques for avoiding erroneous response of monitor circuits to transient conditions incident to startup or turnon are satisfactory to many processes or equipments, the present invention arose in the application of monitor circuits to unattended communications systems. In a specific application, a communications station may employ a microwave transmitter having a travelling wave tube amplifier. When power is first applied to the travelling wave tube, the cathode to helix current may experience a current transient that could be an order of magnitude larger than the normal steady-state operating current. Such a transient is normal and should not result in turnoff of the transmitter due to the erroneous detection of an abnormal condition by the helix overcurrent monitor. On the other hand, it is possible that the travelling wave tube may be turned on into a fault condition which could result in damage to the travelling wave tube occurring during the period of a normal turnon transient condition. Under such conditions, if the monitor circuit is disabled for the period of the turnon transient, there is no protection against a fault until that period has passed. Because only a small amount of energy is required to damage a travelling wave tube, a delay until the transient period has passed cannot be allowed. For the same reason, it is even worse to slow the response time of the monitor circuit to allow the transient to pass unnoticed because the slow response would apply also to all operations of the monitor circuit. Therefore, the monitor circuit must be capable of not only sensing current slightly above the transient level during the period of the turnon transient but it also must be able to respond quickly.

SUMMARY OF THE INVENTION

According to the present invention, a gain switched device is adapted to be connected between a monitored device and monitor circuits, and means are provided for controlling the gain switch device to decrease the gain thereof immediately after startup or turnon so that the sensitivity of the monitor circuits is decreased during the period of the startup or turnon transient. The gain switched device permits the gain to be programmed in any desired minor by control circuits. A change in gain directly changes the sensitivity, or range, of the monitor circuits. In the specific application of a helix overcurrent monitor for a travelling wave tube, a preferred embodiment employs an operational amplifier as the gain switched device. More specifically, the operational amplifier is provided with input and feedback resistances which determine the gain of the amplifier during steady-state conditions. A second resistor is switched into the feedback of the operational amplifier for the period of the transient produced when power is turned on. Alternatively, the gain of the operational amplifier is changed by switching in a different input resistor during the period of the turnon transient. In the specific application to a helix overcurrent monitor, the invention has the advantage of providing fast and definite overcurrent protection in either of two levels. Because of this dual mode of operation, the circuit is well protected both during normal operating conditions and the turnon transient.

BRIEF DESCRIPTION OF THE DRAWINGS

The foregoing and other objects, uses, aspects and advantages of the invention will clearly appear from the following description together with the accompanying drawing, in which.

DESCRIPTION OF THE PREFERRED EMBODIMENT

Figure 1:
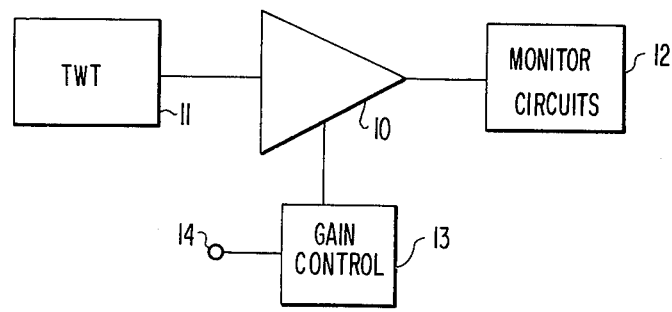
FIG. 1 is a block diagram of the basic form of the variable sensitivity monitor circuit according to the invention.

The simplest form of the invention is illustrated in FIG. 1 and comprises a variable gain element 10 connected between a monitored device 11 and monitor circuit 12. A gain control 13 controls the gain of the variable gain element 10. In the specific application which gave rise to the present invention, the monitored device is a travelling wave tube and the monitor circuit detects helix overcurrent. The gain control 13 is energized by a power turnon signal applied at terminal 14 to decrease the gain of the variable gain element 10 for a period of time equal to the time of the normal turnon transient. Thus, the gain control 13 may include a simple time delay circuit. The variable gain element 10 could be an attenuator but is preferably a variable gain amplifier. An amplifier has the advantage of providing a wider range of sensitivity and isolation between the monitored device and the monitor circuit.

In the preferred embodiment the variable gain amplifier is an operational amplifier having a gain determined by the ratio of its feedback and input resistors. This relationship is expressed as follows:

$$A_o = -(R_f/R_i) \times A_i$$

where $A_i$ is the magnitude of the input signal, $A_o$ is the magnitude of the output signal, $R_f$ is the resistance value of the feedback resistor and $R_i$ is the resistance value of the input resistor. The negative sign in the foregoing relationship is for the case of a single stage of amplification, and the output can be inverted by the provision of a second stage of amplification. Commercially available operational amplifiers usually offer this choice. As will be appreciated from the foregoing relationship, the gain of the operational amplifier, that is, the ratio of $A_o/A_i$ is directly proportional to the ratio of the feedback and input resistance values, $R_f$ and $R_i$. Thus, a decrease in feedback resistance value for a given input resistance value or an increase in input resistance value for a given feedback resistance value will result in a decrease in the gain of the operational amplifier.

Figure 2:
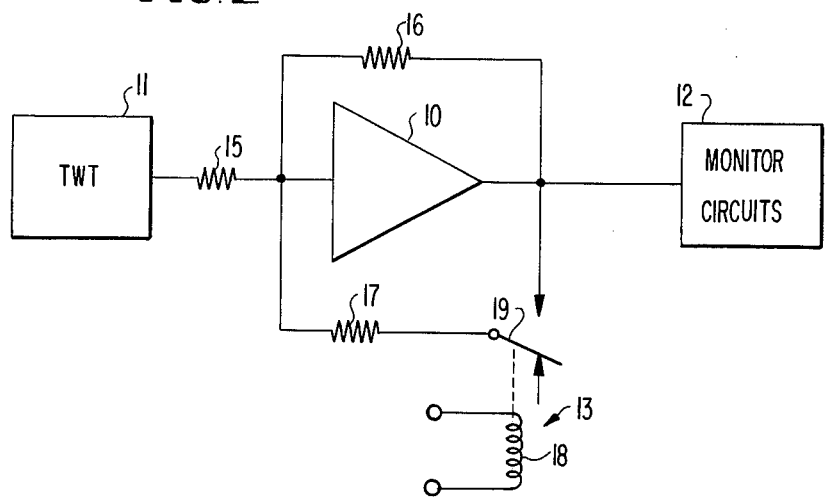
FIG. 2 is a block diagram of a preferred embodiment of the invention employing an operational amplifier having a switched feedback resistor.

Referring now to FIG. 2, the operational amplifier 10 is provided with an input resistor 15 connected between the monitored device 11 and the input to the operational amplifier 10. A first feedback resistor 16 is connected between the input and output of the operational amplifier 10. A second feedback resistor 17 is connected at one end to the input of the operational amplifier 10 and at the other end by means of a switchable connection to the output of the amplifier 10. In a simple realization of the gain control 13, a switching element in the form of a relay comprising an armature 18 and an armature actuated switchblade 19 can be used to selectively connect the feedback resistor 17 to the output of the operational amplifier 10. The relay may be time delay relay actuated upon power turnon but automatically deactivated after a predetermined period of time corresponding to the transient period. Obviously, other switching devices such as solid state switches could be used instead of the relay illustrated.

Figure 3:
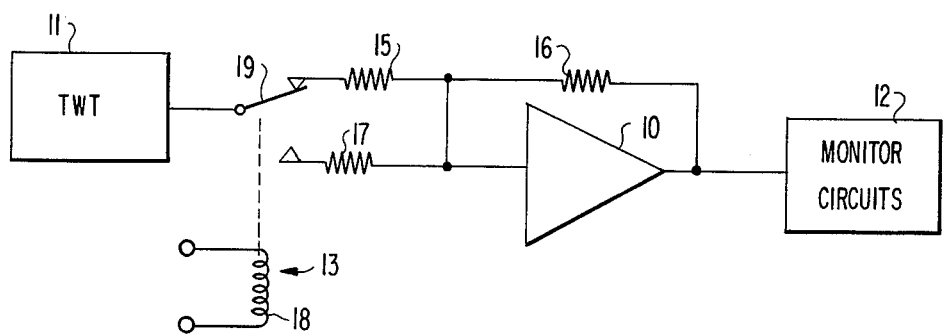
FIG. 3 is a block diagram of an alternative form of the preferred embodiment of the invention employing an operational amplifier employing switched input resistors.

In the operation of the circuit illustrated in FIG. 2, the parallel combination of the feedback resistors 16 and 17 causes an overall decrease in the value of the feedback resistance as compared to the condition when the feedback resistor 17 is not connected to the output of the operational amplifier 10. This decrease in feedback resistance value results in a decrease in gain of the operational amplifier which, in turn, decreases the sensitivity, or range, of the monitor circuit 12. A similar decrease in gain can also be attained in the modification shown in FIG. 3. In this figure, the operational amplifier 10 is provided with a input resistor 15 and a feedback resistor 16 which determine the gain of the operational amplifier during steady-state operation of the monitored device. However, instead of the resistor 17 being switched into and out of the feedback circuit of the operational amplifier, the resistor 17 is instead connected to one contact of the relay. The input resistor 15 is connected to the other contact of the relay instead of being directly connected to the monitored device. Thus, operation of the relay connects the monitored device 11 by way of switch blade 19 to either of the two input resistors 15 or 17. The resistor 17 has a higher value than the resistor 15 so that when the relay is actuated during the turnon transient, a higher input resistance value is substituted in the operational amplifier circuit. This higher input resistance value results in a decrease in gain of the operational amplifier and, therefore, a decrease in sensitivity of the monitor circuit 12.

It will be appreciated by those skilled in the art that the variable sensitivity monitor circuit, while particularly useful when applied to a helix overcurrent monitor in a travelling wave tube for a communication station, will be advantageous in many other applications. More specifically, the variable sensitivity monitor circuit according to the invention will be indispensable in any situation where the monitor must be capable of responding to abnormal conditions slightly above a transient level and where the response time of the monitor circuit cannot be impaired.

What is claimed is:

1. In a process or equipment of the type wherein process or equipment conditions are monitored to detect an abnormal condition and wherein when said process or equipment is first started up or turned on, a transient having a magnitude substantially larger than the steady-state monitored condition limits is normally produced, the improvement comprising:

a gain switched device adapted to be connected between a monitored device a monitor circuit for detecting said abnormal condition of the monitored device, and means actuated at start-up or turn-on of the monitored device for controlling said gain switched device to decrease the gain thereof during said transient and thereafter increase the gain of said gain switched device to a normal steady-state level thereby changing the sensitivity of the monitor circuit during the transient period from that during normal steady-state operation, said gain being decreased at start-up or turn-on by an amount sufficient to prevent expected transients normally encountered at start-up or turn-on from falsely indicating an abnormal condition, while allowing abnormal transients to be recognized during turn-on or start-up.

2. The improvement as recited in claim 1 wherein said gain switched device is a variable gain amplifier.

3. The improvement as recited in claim 1 wherein said gain switched device comprises:

an operational amplifier having an input and an output, an input resistor connected to the input of said operational amplifier, a first feedback resistor connected between the input and output of said operational amplifier, the ratio of the resistance values of the first feedback resistor and the input resistor determining the gain of said operational amplifier during steady-state conditions, and at least one second, switched feedback resistor switchably connected under control of said controlling means between the input and output of said operational amplifier, the ratio of the resistance values of the parallel combination of the first and second feedback resistors and the input resistor determining the gain of said operational amplifier during said transient.

4. The improvement as recited in claim 1 wherein said gain switched device comprises:

an operational amplifier having an input and an output, a feedback resistor connected between the input and output of said operational amplifier, a first input resistor connected to the input of said operational amplifier, and switchably connected to said monitored device, the ratio of the resistance values of the feedback resistor and the first input resistor determining the gain of said operational amplifier during steady-state conditions, and at least one second input resistor connected to the input of said operational amplifier and switchably connected to said monitored device, the ratio of the resistance values of the feedback resistor and the second input resistor determining the gain of said operational amplifier during said transient.

5. The improvement as recited in claim 1, wherein the monitored device is a travelling wave tube and the monitor circuit detects helix overcurrent.

* * * * *